(12) United States Patent
Van Zwet et al.

(10) Patent No.: US 9,316,926 B2
(45) Date of Patent: Apr. 19, 2016

(54) LITHOGRAPHIC APPARATUS AND DEVICE MANUFACTURING METHOD

(75) Inventors: Erwin John Van Zwet, Pijnacker (NL); Pieter Willem Herman De Jager, Middelbeers (NL); Johannes Onvlee, 's-Hertogenbosch (NL); Hendrik De Man, Hendrik Ido Amabacht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 320 days.

(21) Appl. No.: 13/885,960

(22) PCT Filed: Nov. 15, 2011

(86) PCT No.: PCT/EP2011/070147
§ 371 (c)(1),
(2), (4) Date: May 16, 2013

(87) PCT Pub. No.: WO2012/076300
PCT Pub. Date: Jun. 14, 2012

(65) Prior Publication Data
US 2013/0250267 A1     Sep. 26, 2013

Related U.S. Application Data

(60) Provisional application No. 61/420,965, filed on Dec. 8, 2010.

(51) Int. Cl.
*G03F 7/20* (2006.01)

(52) U.S. Cl.
CPC ............ *G03F 7/70641* (2013.01); *G03F 7/704* (2013.01); *G03F 7/70216* (2013.01);
(Continued)

(58) Field of Classification Search
CPC ............ G03F 7/70216; G03F 7/70258; G03F 7/70275; G03F 7/70375; G03F 7/70383; G03F 7/70391; G03F 7/704
See application file for complete search history.

(56) References Cited

U.S. PATENT DOCUMENTS 4,090,206 A     5/1978   Pfeifer
4,447,126 A     5/1984   Heidrich
(Continued)

FOREIGN PATENT DOCUMENTS

DE     4315580     11/1994
DE     4315581     11/1994
(Continued)

OTHER PUBLICATIONS

LOT-Oriel Group Europe, "MicroWriter™ Laser Lithography System," www.LOT-Oriel.com (2 pp, date unknown, obtained Jul. 2010).
(Continued)

*Primary Examiner* — Toan Ton
*Assistant Examiner* — Michelle M Iacoletti
(74) *Attorney, Agent, or Firm* — Pillsbury Winthrop Shaw Pittman LLP

(57) ABSTRACT

A system to control the focus of a mask-less lithographic apparatus, the apparatus including a projection system to project an image of a programmable patterning device onto a substrate. A first actuator system is configured to move at least one of the lenses of the projection system in a direction perpendicular to the optical axis of the projection system. A radiation beam expander is configured to project an image of the programmable patterning device onto the at least one lens. A second actuator system is configured to move the radiation beam expander in a direction parallel to the optical axis of the projection system in order to control the focus of the image projected onto the substrate.

18 Claims, 5 Drawing Sheets

(52) U.S. Cl.
CPC ........ *G03F 7/70258* (2013.01); *G03F 7/70266* (2013.01); *G03F 7/70275* (2013.01); *G03F 7/70375* (2013.01); *G03F 7/70383* (2013.01); *G03F 7/70391* (2013.01)

(56) References Cited

U.S. PATENT DOCUMENTS

| | | | |
|---|---|---|---|
| 4,520,472 | A | 5/1985 | Reno |
| 4,525,729 | A | 6/1985 | Agulnek |
| 4,640,573 | A | 2/1987 | Kataoka |
| 4,780,730 | A | 10/1988 | Dodge |
| 4,796,038 | A | 1/1989 | Allen |
| 4,844,568 | A | 7/1989 | Suzuki |
| 4,864,216 | A | 9/1989 | Kalata |
| 4,952,949 | A | 8/1990 | Uebbing |
| 5,051,762 | A | 9/1991 | Lea |
| 5,216,247 | A | 6/1993 | Wang |
| 5,216,534 | A | 6/1993 | Boardman |
| 5,229,872 | A | 7/1993 | Mumola |
| 5,296,891 | A | 3/1994 | Vogt |
| 5,457,488 | A | 10/1995 | Nakamura |
| 5,481,392 | A | 1/1996 | Damer |
| 5,523,193 | A | 6/1996 | Nelson |
| 5,568,320 | A | 10/1996 | Rees |
| 5,589,973 | A | 12/1996 | King |
| 5,610,754 | A | 3/1997 | Gheen |
| 5,668,587 | A | 9/1997 | Hammond |
| 5,705,788 | A | 1/1998 | Beyer |
| 5,838,024 | A | 11/1998 | Masuda |
| 5,840,451 | A | 11/1998 | Moore |
| 6,037,965 | A | 3/2000 | Gross |
| 6,133,986 | A | 10/2000 | Johnson |
| 6,204,875 | B1 | 3/2001 | De Loor |
| 6,268,613 | B1 | 7/2001 | Cantu |
| 6,310,710 | B1 | 10/2001 | Shahar |
| 6,313,862 | B1 | 11/2001 | Berner |
| 6,466,352 | B1 | 10/2002 | Shahar |
| 6,531,681 | B1 | 3/2003 | Markle |
| 6,559,438 | B1 | 5/2003 | Drobot |
| 6,683,727 | B1 | 1/2004 | Goring |
| 6,765,647 | B1 | 7/2004 | Nishi |
| 6,795,169 | B2 | 9/2004 | Tanaka |
| 6,967,711 | B2 | 11/2005 | Gui |
| 7,116,402 | B2 | 10/2006 | Gui |
| 7,116,404 | B2 | 10/2006 | Lof et al. |
| 7,969,636 | B2 | 6/2011 | Naito |
| 7,969,853 | B2 * | 6/2011 | Nakatani et al. ......... 369/112.24 |
| 8,531,648 | B2 | 9/2013 | De Jager et al. |
| 2002/0115021 | A1 | 8/2002 | Piao |
| 2002/0126479 | A1 | 9/2002 | Zhai |
| 2002/0171047 | A1 | 11/2002 | Chan |
| 2003/0043582 | A1 | 3/2003 | Chan |
| 2003/0091277 | A1 | 5/2003 | Mei |
| 2003/0140806 | A1 | 7/2003 | Sandstrom |
| 2003/0174301 | A1 * | 9/2003 | Imanishi .................. 355/55 |
| 2004/0124372 | A1 | 7/2004 | Gil |
| 2004/0135159 | A1 | 7/2004 | Siegel |
| 2004/0257629 | A1 | 12/2004 | Noehte |
| 2005/0167508 | A1 | 8/2005 | Syms |
| 2006/0001855 | A1 | 1/2006 | Lof |
| 2006/0103719 | A1 | 5/2006 | Katzir |
| 2006/0108508 | A1 | 5/2006 | Khalid |
| 2007/0034890 | A1 | 2/2007 | Daschner |
| 2007/0182808 | A1 | 8/2007 | Stiblert |
| 2007/0296936 | A1 | 12/2007 | Kato |
| 2008/0042969 | A1 | 2/2008 | Baker |
| 2008/0047445 | A1 | 2/2008 | Berner |
| 2008/0137051 | A1 | 6/2008 | Maly |
| 2008/0160211 | A1 | 7/2008 | Siegel |
| 2008/0210888 | A1 | 9/2008 | Inoue |
| 2009/0296063 | A1 | 12/2009 | Opower |
| 2010/0142757 | A1 | 6/2010 | Sandstrom |
| 2010/0265557 | A1 | 10/2010 | Sallander |
| 2010/0303116 | A1 * | 12/2010 | Murayama et al. ........ 372/49.01 |
| 2011/0051211 | A1 | 3/2011 | Walther |
| 2011/0188016 | A1 * | 8/2011 | De Jager et al. ............ 355/55 |

FOREIGN PATENT DOCUMENTS

| | | |
|---|---|---|
| DE | 19813127 | 10/1998 |
| EP | 1 522 893 | 4/2005 |
| EP | 1 835 347 | 9/2007 |
| JP | 57-152273 | 9/1982 |
| JP | 06-275936 | 9/1994 |
| JP | 2000-507749 | 6/2000 |
| JP | 2000-197984 | 7/2000 |
| JP | 2003-220484 | 8/2003 |
| JP | 2004-502197 | 1/2004 |
| JP | 2006-024924 | 1/2006 |
| JP | 2010-027755 | 2/2010 |
| TW | 201015244 | 4/2010 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050023 | 5/2007 |
| WO | WO 2007/050022 | 5/2007 |
| WO | 2007/098935 | 9/2007 |
| WO | 2008/071347 | 6/2008 |
| WO | WO 2009/141994 | 11/2009 |
| WO | WO 2010/032224 | 3/2010 |
| WO | 2010/151123 | 12/2010 |
| WO | 2011/026610 | 3/2011 |
| WO | WO 2011/059958 | 5/2011 |
| WO | WO 2011/104171 | 9/2011 |
| WO | WO 2011/104178 | 9/2011 |

OTHER PUBLICATIONS

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.

Taiwan Office Action dated Jan. 21, 2014 in corresponding Taiwan Patent Application No. 100144705.

Japanese Office Action dated Jun. 10, 2014 in corresponding Japanese Patent Application No. 2013-541282.

Korean Office Action mailed Jul. 26, 2014 in corresponding Korean Patent Application No. 10-2013-7015436.

International Search Report mailed Apr. 12, 2012 in corresponding International Application No. PCT/EP2011/070147.

Rainer Schuhmann et al., "Telezentrische Systeme für die optische Meß- und Prüftechnik" Technisches Messen, vol. 65, No. 4, pp. 131-136 (Jan. 1, 1998).

Anonymous, "Lithographic apparatus and device manufacturing method," Research Disclosure, vol. 5511 No. 29, 22 pages (Mar. 1, 2010).

Thomas Thönlβ, "Laser Beam Expanders, Basics and Applications," LINOS Technical Papers, No. 1, pp. 11-14 (First Quarter 2004).

* cited by examiner

LITHOGRAPHIC APPARATUS AND DEVICE MANUFACTURING METHOD

CROSS-REFERENCE TO RELATED APPLICATIONS

This application is the U.S. national phase entry of PCT Patent Application No. PCT/EP2011/070147, filed on Nov. 15, 2011, which claims the benefit of priority of U.S. provisional application 61/420,965, which was filed on Dec. 8, 2010 and which is incorporated herein in its entirety by reference.

FIELD

The present invention relates to a lithographic apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like.

SUMMARY

A maskless lithographic apparatus may be provided with, for example, an optical column capable of creating a pattern on a target portion of a substrate. The optical column may be provided with: a self emissive contrast device configured to emit a beam and a projection system configured to project at least a portion of the beam onto the target portion. The apparatus may be provided with an actuator to move the optical column or a part thereof with respect to the substrate. Thereby, the substrate may be moved with respect to the beam. By switching "on" or "off" the self-emissive contrast device during the movement, a pattern on the substrate may be created.

In a lithographic process, it is important to ensure that the image projected onto a substrate is accurately focused. In particular, in some maskless lithography arrangements, the focusing range may be relatively small in comparison to a mask based system with the same critical dimension. For example, in a known maskless system, a plurality of lenses are each used to project spots of radiation onto the substrate, resulting in a relatively small focusing range. It has therefore been known to provide a system to adjust the focus by adjusting the position of the substrate relative to the projection system in a direction perpendicular to the optical axis of the projection system.

However, in some applications, the substrates may not be sufficiently flat for there to be a signal focus level for the entire width of the exposure field. Accordingly, in such a situation, it is not possible to provide the desired focus control simply by adjusting the position of the substrate relative to the projection system in a direction parallel to the optical axis of the projection system.

It is therefore desirable to provide an improved focusing system.

According to an embodiment of the invention, there is provided a lithographic apparatus having at least one optical column comprising:
 a programmable patterning device configured to provide a plurality of radiation beams; and
 a projection system configured to project the plurality of beams onto the substrate;
 wherein the projection system comprises a plurality of lenses; and
 the optical column comprises:
  a first actuator system, configured to move at least one of said lenses in a direction perpendicular to the optical axis of the projection system to scan the plurality of beams over a target portion of the substrate;
  a radiation beam expander, configured to project an image of the programmable patterning device onto said at least one lens; and
  a second actuator system, configured to move the radiation beam expander in a direction parallel to the optical axis of the projection system.

According to an embodiment of the invention, there is provided a device manufacturing method, comprising:
 creating a pattern on a target portion of a substrate using at least one optical column having a programmable patterning device configured to provide a plurality of radiation beams and a projection system configured to project the plurality of beams onto said target portion of the substrate, the projection system comprising a plurality of lenses;
 moving at least one of said lenses in a direction perpendicular to the optical axis of the projection system to scan the plurality of beams over the target portion of the substrate;
 using a radiation beam expander to project an image of the programmable patterning device onto said at least one lens; and
 controlling the position of the radiation beam expander in a direction parallel to the optical axis of the projection system in order to adjust the focus of the image formed on the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
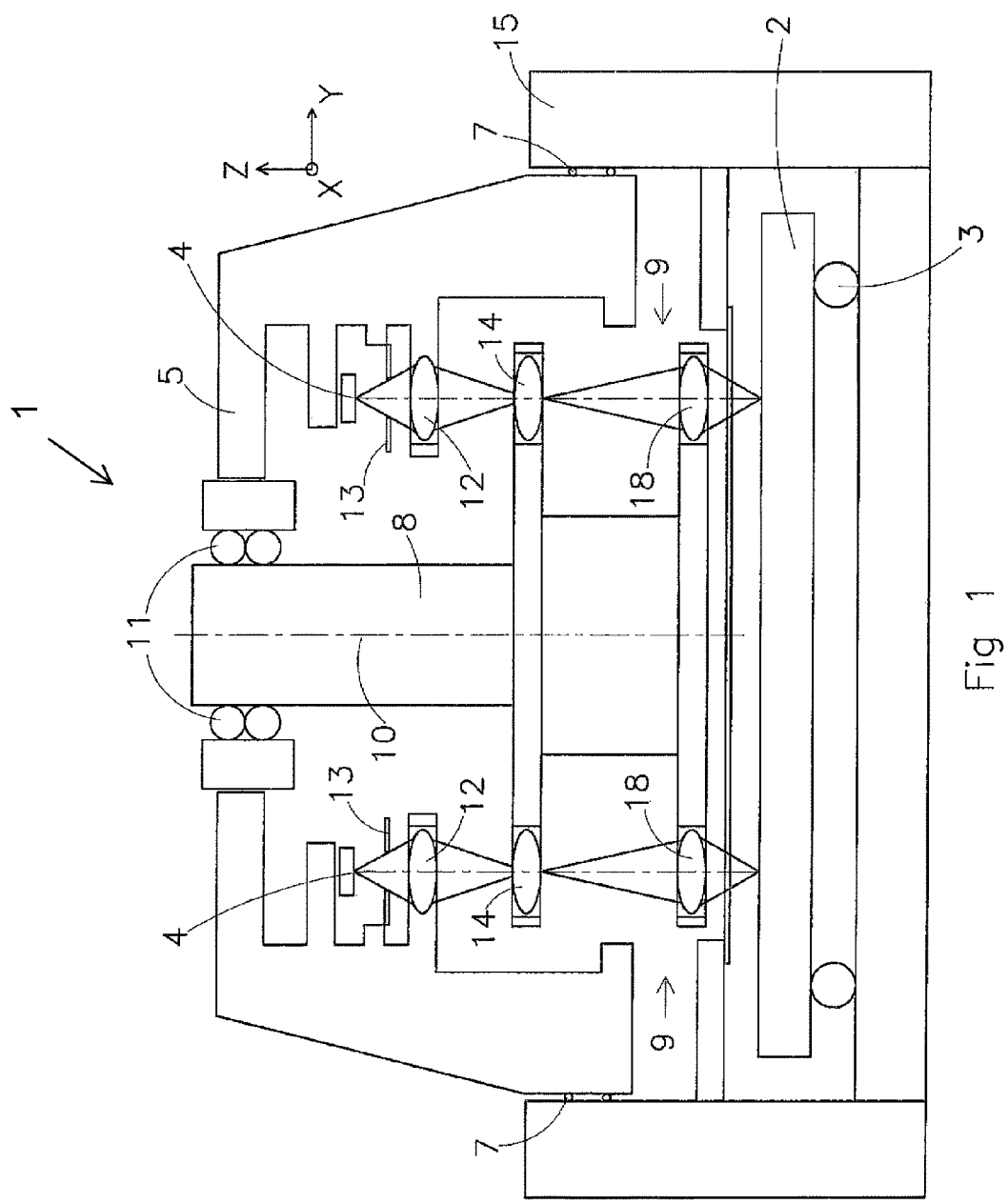
FIG. 1 depicts a part of a lithographic apparatus according to an embodiment of the invention.

FIG. 1 schematically depicts a schematic cross-sectional side view of a part of a lithographic apparatus. In this embodiment, the lithographic apparatus has individually controllable elements substantially stationary in the X-Y plane as discussed further below although it need not be the case. The lithographic apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the lithographic apparatus is suitable for roll-to-roll manufacturing.

The lithographic apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
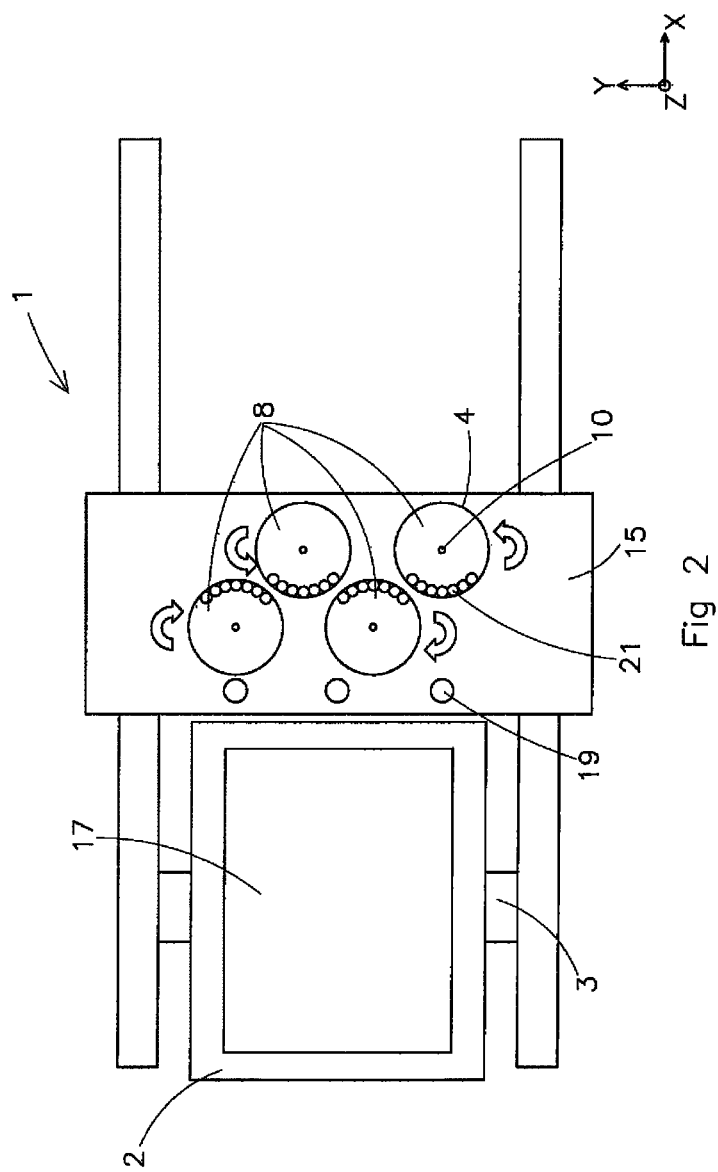
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the lithographic apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The lithographic apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic apparatus of FIG. 1 having self-emissive contrast devices 4. Like the lithographic apparatus 1 shown in FIG. 1, the lithographic apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4. A rotating frame 8 may be provided which may be rotating in a direction depicted by the arrow.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
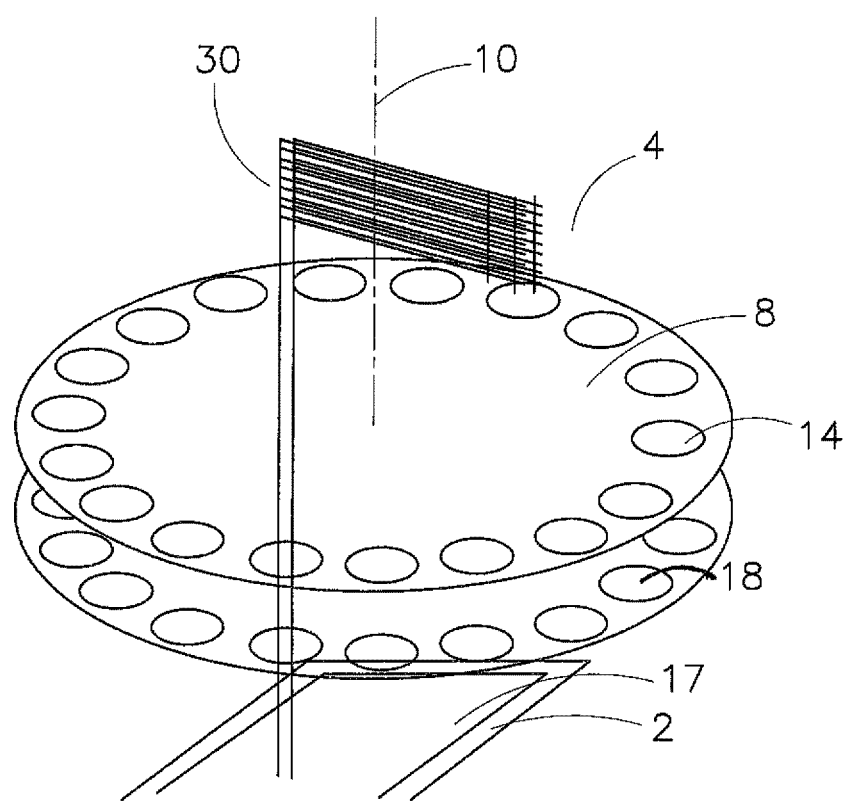
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
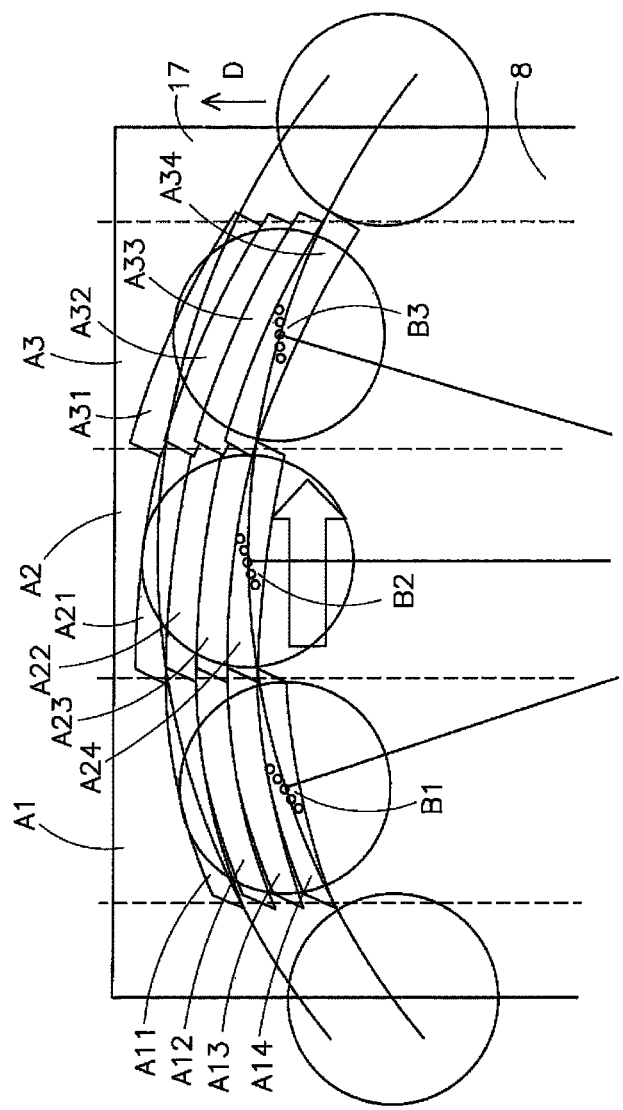
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the lithographic apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

In an embodiment of the invention, a system is provided for controlling the focus of an image projected onto a substrate. The arrangement may be provided to adjust the focus of the image projected by part or all of an optical column in an arrangement as discussed above.

Figure 5:
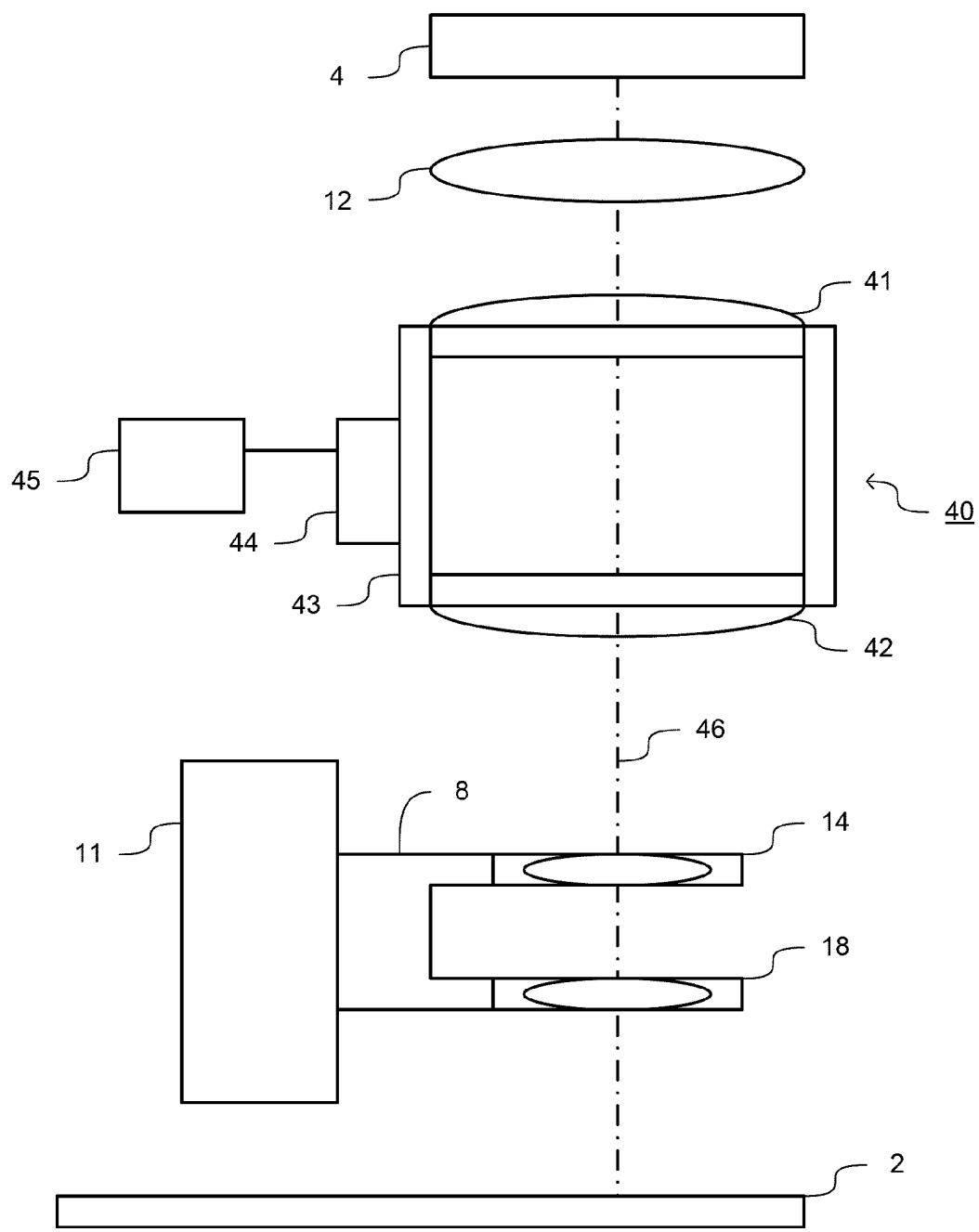
FIG. 5 depicts an arrangement of a system for controlling focus according to an embodiment of the invention.

As depicted in FIG. 5, the focus adjustment arrangement may include a radiation beam expander 40 that is arranged such that the image of the programmable patterning device 4 projected onto the field lens 14, discussed above, is projected via the radiation beam expander 40. The field lens 14 and the imaging lens 18, discussed above, are arranged such that an image projected onto the field lens 14 is projected onto a substrate supported on the substrate table 2. Therefore, by adjusting the position, in a direction parallel to the optical axis 46 of the projection system, of the image projected onto the field lens 14, the focus of the image formed at the level of the substrate may be adjusted. As will be discussed further below, the radiation beam expander 40 is used to provide such an adjustment of the position of the image projected onto the field lens 14.

This may be advantageous because it means that focus adjustment may be performed without adjusting the position of the substrate relative to the projection system. This may enable accurate focus control independently for different areas located across the full width of the illumination field on the substrate. For example, each optical column, or part thereof, may have independent capability to adjust the focus of the image it is projecting onto the substrate.

Furthermore, such an arrangement does not require adjusting the position of the field lens 14 or the imaging lens 18 in a direction parallel to the optical axis 46 of the projection system.

Such control may be difficult in an arrangement in which, as discussed above, the field lens 14 and the imaging lens 18 are arranged to move in a direction perpendicular to the optical axis 46 of the projection system. For example, as depicted in FIG. 5, and consistent with the arrangements discussed above, the field lens 14 and the imaging lens 18 may be mounted to a rotating frame 8 that is driven by a first actuator system 11.

The radiation beam expander 40 may be formed from a pair of axially aligned positive lenses 41,42. The lenses 41,42 may be fixedly positioned relative to each other, for example by means of a rigid support frame 43.

In an embodiment, the radiation beam expander 40 may be configured such that it is both object-space telecentric and image-space telecentric. It will be understood that, by object-space telecentric, we mean that the entrance pupil is located at infinity and, by image-space telecentric, we mean that the exit pupil is located at infinity.

A second actuator system 44 may be provided and arranged in order to control the position of the radiation beam expander 40 in a direction parallel to the optical axis 46 of the projection system.

In particular, the second actuator system 44 may be configured to act on the support frame 43 in order to adjust the position of the first and second lens 41,42 relative to the field lens 14 whilst maintaining the relative positions of the first and second lenses 41,42.

The second actuator system 44 may particularly be configured in order to ensure that the radiation beam expander 40 only moves in a direction parallel to the optical axis 46 and such that there is substantially no movement of the radiation beam expander 40 in a direction perpendicular to the optical axis 46 of the projection system. Movement of the radiation beam expander 40 in the direction parallel to the optical axis 46 of the projection system is used to adjust the position of the image of the programmable patterning device 4 projected onto the field lens 14.

A controller 45 may be provided that is adapted to control the second actuator 44 in order to move the radiation beam expander 40 in an appropriate manner in order to provide the desired focus control of the image projected onto the substrate. In particular, movement of the radiation beam expander 40 along the optical axis 46 of the projection system is proportional to the consequent focus shift at the substrate. Accordingly, the controller may store a predetermined multiple for the system and use this to convert a desired focus shift at the substrate to a required movement of the radiation beam expander 40. Subsequently, the controller 45 may control the second actuator system 44 in order to provide the desired movement.

The required focus shift at the level of the substrate may be determined, for example, from a measurement of the position of the substrate and/or substrate table 2, in conjunction with a measurement of the distortion of the upper surface of the substrate at a target portion on which an image is to be projected. The distortions of the upper surface of the substrate may be mapped prior to exposure of the pattern on the substrate and/or may be measured for each portion of the substrate immediately before the pattern is projected onto that portion of the substrate.

The multiple relating the movement of the radiation beam expander 40 to the focus shift at the substrate may be determined by the formula below $$(1/B^2)/(A^2-1)$$

in which A is the magnification of the radiation beam expander 40 and B is the magnification of the optical system from the lens 14 onto which the radiation beam expander projects an image of the programmable patterning device, to the substrate, namely the magnification of the combination of the field lens 14 and the imaging lens 18.

In an exemplary embodiment, the magnification of the combined system of the field lens 14 and the imaging lens 18 may be 1/15 (i.e. demagnification) and the magnification of the radiation beam expander 40 may be 2. Accordingly, using the formula above, it will be seen that for a focus shift of 25 μm at the level of the substrate, the required movement of the radiation beam expander is 1.875 mm.

As noted above, the focusing arrangement of the present invention may be provided separately for each optical column within a lithographic apparatus. Accordingly, it will be appreciated that each optical column may include a respective radiation beam expander 40 and associated actuator system 44 arranged to move the respective radiation beam expander 40 in a direction parallel to the optical axis 46 of the projection system.

In accordance with an embodiment of the invention, an intensity of each of the self-emissive contrast devices (e.g. laser diodes) may be modulated during the movement of the part of the optical column (in this example, the rotation of the rotatable frame 8 and lenses 14, 18) so as to irradiate a desired pattern onto the substrate. It is noted that the described concept wherein a part of the optical column, namely the frame 8 and lenses 14, 18 is rotatable, allows high speed of movements of the lenses 14, 18 at a high accuracy and reproducibility of movement.

In the embodiments as depicted, a pair of lenses 14, 18 together forms a projection entity to project the at least two beams onto the substrate. It will be understood that such projection entity may comprise one or more lenses. Hence, an embodiment of the invention may be understood in a way that at least two of the beams are projected onto the substrate by a same one of the projection entities from a plurality of projection entities of the rotatable frame, each projection entity comprising at least one lens and being arranged to project the at least two beams onto the substrate.

In accordance with a device manufacturing method, a device, such as a display, integrated circuit or any other item may be manufactured from the substrate on which the pattern has been projected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus having at least one optical column, the optical column comprising:
   a programmable patterning device configured to provide a plurality of radiation beams;
   a projection system configured to project the plurality of beams onto a substrate, the projection system comprising a plurality of lenses;
   a first actuator system, configured to move at least one of the lenses in a direction perpendicular to the optical axis of the projection system to scan the plurality of beams over a target portion of the substrate;
   a radiation beam expander, configured to project an image of the programmable patterning device onto the at least one lens;
   a second actuator system, configured to move the radiation beam expander in a direction parallel to the optical axis of the projection system; and
   a control system configured to control the second actuator system in order to control a focus between the substrate and the at least one lens to a certain position.

2. The lithographic apparatus according to claim 1, wherein the radiation beam expander comprises a pair of axially aligned positive lenses arranged at a fixed separation.

3. The lithographic apparatus according to claim 1, wherein the radiation beam expander is configured to be both object-space telecentric and image-space telecentric.

4. The lithographic apparatus according to claim 1, wherein the at least one lens onto which the radiation beam expander projects the image of the programmable patterning device is a field lens;
   the projection system further comprises an imaging lens, arranged such that the image projected onto the field lens is projected onto the substrate; and
   the positions of the field lens and the imaging lens are fixed relative to each other and can be moved by the first actuator system.

5. The lithographic apparatus according to claim 4, wherein the field lens and the imaging lens are mounted to a frame rotatable about an axis parallel to the optical axis of the projection system.

6. The lithographic apparatus according to claim 1, wherein the second actuator system is configured to prevent movement of the radiation beam expander in a direction perpendicular to the optical axis of the projection system while moving the radiation beam expander in the direction parallel to the optical axis of the projection system.

7. The lithographic apparatus according to claim 1, wherein the control system is further configured to:
   receive a signal relating to a focus displacement at the substrate;
   convert the signal to a displacement of the radiation beam expander, based on a multiple of the focus displacement at the substrate; and
   output a signal to the second actuator system to effect the displacement of the radiation beam expander.

8. The lithographic apparatus according to claim 7, wherein the multiple is $$B^2/(A^2-1)$$

in which A is the magnification of the radiation beam expander and B is the magnification of the optical system from the at least one lens onto which the radiation beam expander projects an image of the programmable patterning device to the substrate.

9. The lithographic apparatus according to claim 1 having at least a second optical column comprising:
   a second programmable patterning device configured to provide a second plurality of radiation beams; and
   a second projection system configured to project the second plurality of beams onto the substrate, the second projection system comprising a second plurality of lenses;
   a third actuator system, configured to move at least one of the second plurality of lenses of the second projection system in a direction perpendicular to the optical axis of the second projection system to scan the second plurality of beams over a target portion of the substrate;
   a second radiation beam expander, configured to project an image of the second programmable patterning device onto the at least one lens of the second plurality of lenses of the second projection system; and
   a fourth actuator system, configured to move the second radiation beam expander in a direction parallel to the optical axis of the second projection system.

10. A device manufacturing method, comprising:
   creating a pattern on a target portion of a substrate using at least one optical column having a programmable patterning device configured to provide a plurality of radiation beams and a projection system configured to project the plurality of beams onto the target portion, the projection system comprising a plurality of lenses;

moving at least one of the lenses in a direction perpendicular to the optical axis of the projection system to scan the plurality of beams over the target portion;

using a radiation beam expander to project an image of the programmable patterning device onto the at least one lens; and controlling the position of the radiation beam expander in a direction parallel to the optical axis of the projection system in order to control focus of the image formed on the substrate to a certain position.

11. The method according to claim 10, wherein the radiation beam expander comprises a pair of axially aligned positive lenses arranged at a fixed separation.

12. The method according to claim 10, wherein the radiation beam expander is configured to be both object-space telecentric and image-space telecentric.

13. The method according to claim 10, wherein the at least one lens onto which the radiation beam expander projects the image of the programmable patterning device is a field lens; and the method further comprises:

projecting the image, projected onto the field lens, onto the substrate using an imaging lens of the projection system; and moving the field lens and the imaging lens where the positions of the field lens and the imaging lens are fixed relative to each other.

14. The method according to claim 13, wherein the field lens and the imaging lens are mounted to a frame and the method further comprises rotating the frame about an axis parallel to the optical axis of the projection system.

15. The method according to claim 10, further comprising preventing movement of the radiation beam expander in a direction perpendicular to the optical axis of the projection system while moving the radiation beam expander in the direction parallel to the optical axis of the projection system.

16. The method according to claim 10, further comprising:

receiving a signal relating to a focus displacement at the substrate;

converting the signal to a displacement of the radiation beam expander, based on a multiple of the focus displacement at the substrate; and effecting the displacement of the radiation beam expander.

17. The method according to claim 16, wherein the multiple is $$B^2/(A^2-1)$$

in which A is the magnification of the radiation beam expander and B is the magnification of the optical system from the at least one lens onto which the radiation beam expander projects an image of the programmable patterning device to the substrate.

18. The method according to claim 10, further comprising:

creating a pattern on the substrate using at least a second optical column having a second programmable patterning device configured to provide a second plurality of radiation beams and a second projection system configured to project the second plurality of beams onto the substrate, the second projection system comprising a second plurality of lenses;

moving at least one of the second plurality of lenses in a direction perpendicular to the optical axis of the second projection system to scan the second plurality of beams over the substrate;

using a second radiation beam expander to project an image of the second programmable patterning device onto the at least one lens of the second plurality of lenses; and controlling the position of the second radiation beam expander in a direction parallel to the optical axis of the second projection system.

* * * * *